United States Patent
Nagasawa et al.

(10) Patent No.: US 6,821,340 B2
(45) Date of Patent: Nov. 23, 2004

(54) METHOD OF MANUFACTURING SILICON CARBIDE, SILICON CARBIDE, COMPOSITE MATERIAL, AND SEMICONDUCTOR ELEMENT

(75) Inventors: Hiroyuki Nagasawa, Hachiouji (JP); Takamitsu Kawahara, Kawasaki (JP); Kuniaki Yagi, Oume (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/867,467

(22) Filed: May 31, 2001

(65) Prior Publication Data

US 2002/0072249 A1 Jun. 13, 2002

(30) Foreign Application Priority Data

May 31, 2000 (JP) ........................ 2000-162048

(51) Int. Cl.[7] .................. C30B 25/02; C30B 25/14; C30B 25/16
(52) U.S. Cl. .................. 117/84; 117/88; 117/89; 117/93; 117/102; 117/105; 117/951
(58) Field of Search .............. 117/84, 88, 89, 117/93, 102, 105, 951

(56) References Cited

U.S. PATENT DOCUMENTS

| | | | |
|---|---|---|---|
| 3,386,866 A | | 6/1968 | Ebert et al. |
| 3,630,678 A | * | 12/1971 | Gardner ............... 423/446 |
| 4,040,610 A | | 8/1977 | Szekely |
| 4,666,565 A | * | 5/1987 | Dobson ............. 205/780.5 |
| 4,718,947 A | * | 1/1988 | Arya .................. 136/258 |
| 5,167,935 A | * | 12/1992 | Lerner ................ 422/172 |
| 5,200,022 A | * | 4/1993 | Kong et al. ........... 117/95 |
| 5,225,032 A | * | 7/1993 | Golecki ................ 117/90 |
| 5,254,370 A | * | 10/1993 | Nagasawa et al. ..... 427/249.15 |
| 5,294,564 A | * | 3/1994 | Karapiperis et al. ........ 438/22 |

(List continued on next page.)

FOREIGN PATENT DOCUMENTS

| | | |
|---|---|---|
| JP | 63-57772 | 3/1988 |
| JP | 02-157196 | 6/1990 |
| JP | 02-172895 | 7/1990 |
| JP | 05-1380 A | 1/1993 |
| JP | 07-118854 | 5/1995 |

OTHER PUBLICATIONS

Patent Abstract of Japan, JP 9–052798, Feb. 25, 1997.
Kuniaki Yagi, et al., Journal of Crystal Growth, vol. 174, No. 1–4, pp. 653–657, "3C–SiC Growth by Alternate Supply of $SiH_2Cl_2$ and $C_2H$", Apr. 1, 1997.
R. Yakimova, et al., Diamond and Related Materials, vol. 9, No. 3–6, pp. 432–438, "Current Status and Advances in the Growth of SiC", Apr. 2000.

*Primary Examiner*—Nadine G. Norton
*Assistant Examiner*—Matthew J Song
(74) *Attorney, Agent, or Firm*—Oblon, Spivak, McClelland, Maier & Neustadt, P.C.

(57) ABSTRACT

To provide a method of manufacturing silicon carbide by forming silicon carbide on a substrate surface from an atmosphere containing a silicon carbide feedstock gas comprising at least a silicon source gas and a carbon source gas under condition 1 or 2 below:

Condition 1: the partial pressure ps of silicon source gas is constant (with ps>0), the partial pressure of carbon source gas consists of a state pc1 and a state pc2 that are repeated in alternating fashion, wherein pc1 and pc2 denote partial pressures of carbon source gas, pc1>pc2, and pc1/ps falls within a range of 1–10 times the attachment coefficient ratio (Ss/Sc), pc2/ps falls within a range of less than one time Ss/Sc;

Condition 2: the partial pressure pc of carbon source gas is constant (with pc>0), the partial pressure of silicon source gas consists of a state ps1 and a state ps2 that are repeated in alternating fashion, wherein ps1 and ps2 denote partial pressures of silicon source gas, ps1<ps2, and pc/ps1 falls within a range of 1–10 times Ss/Sc, pc/ps2 falls within a range of less than one time Ss/Sc.

14 Claims, 7 Drawing Sheets

U.S. PATENT DOCUMENTS

| | | | | |
|---|---|---|---|---|
| 5,296,258 A | * | 3/1994 | Tay et al. | 427/96 |
| 5,390,626 A | * | 2/1995 | Nagasawa et al. | 117/84 |
| 5,463,978 A |   | 11/1995 | Larkin et al. | |
| 5,704,985 A | * | 1/1998 | Kordina et al. | 118/725 |
| 5,709,745 A | * | 1/1998 | Larkin et al. | 117/96 |
| 5,863,598 A | * | 1/1999 | Venkatesan et al. | 427/97 |
| 5,937,316 A |   | 8/1999 | Inaba et al. | |
| 5,964,944 A | * | 10/1999 | Sugiyama et al. | 117/107 |
| 5,989,340 A | * | 11/1999 | Stephani et al. | 117/204 |
| 6,139,629 A | * | 10/2000 | Kisielowski et al. | 117/105 |

* cited by examiner

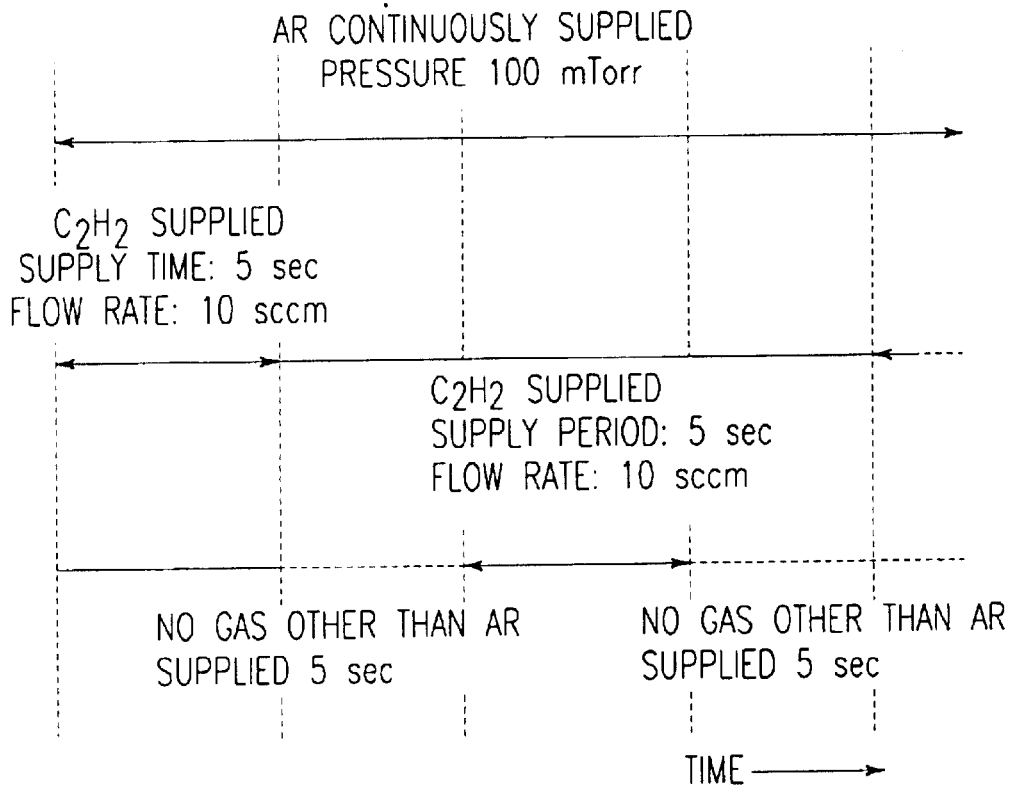
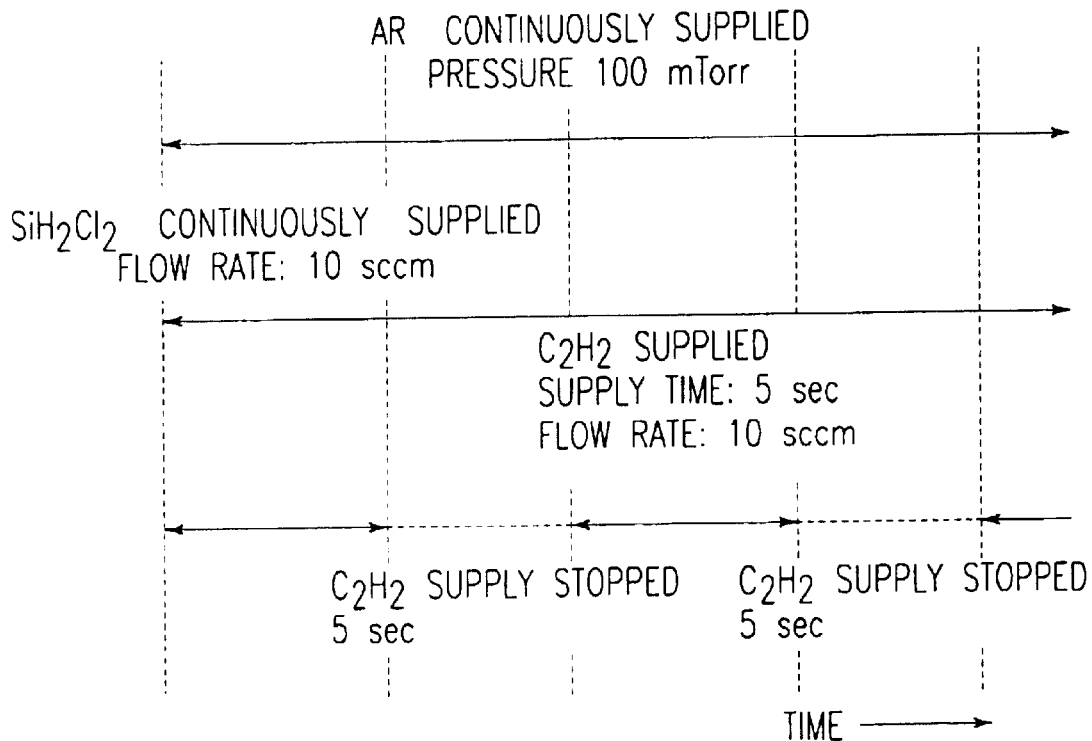

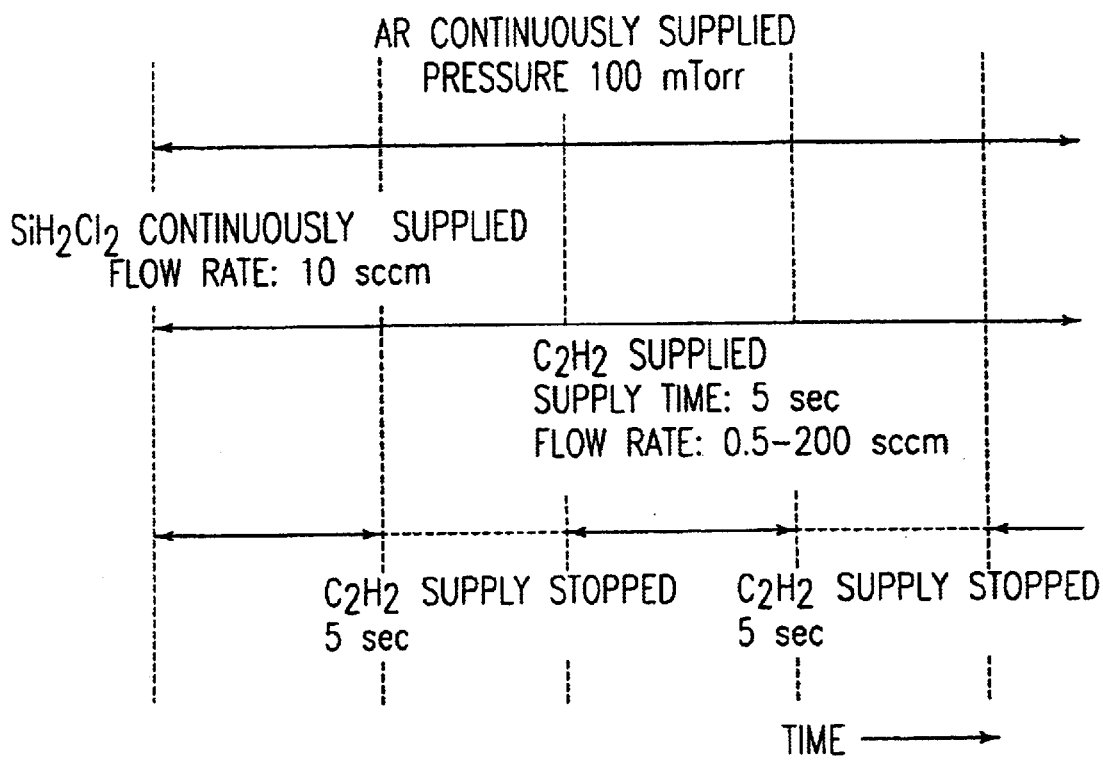
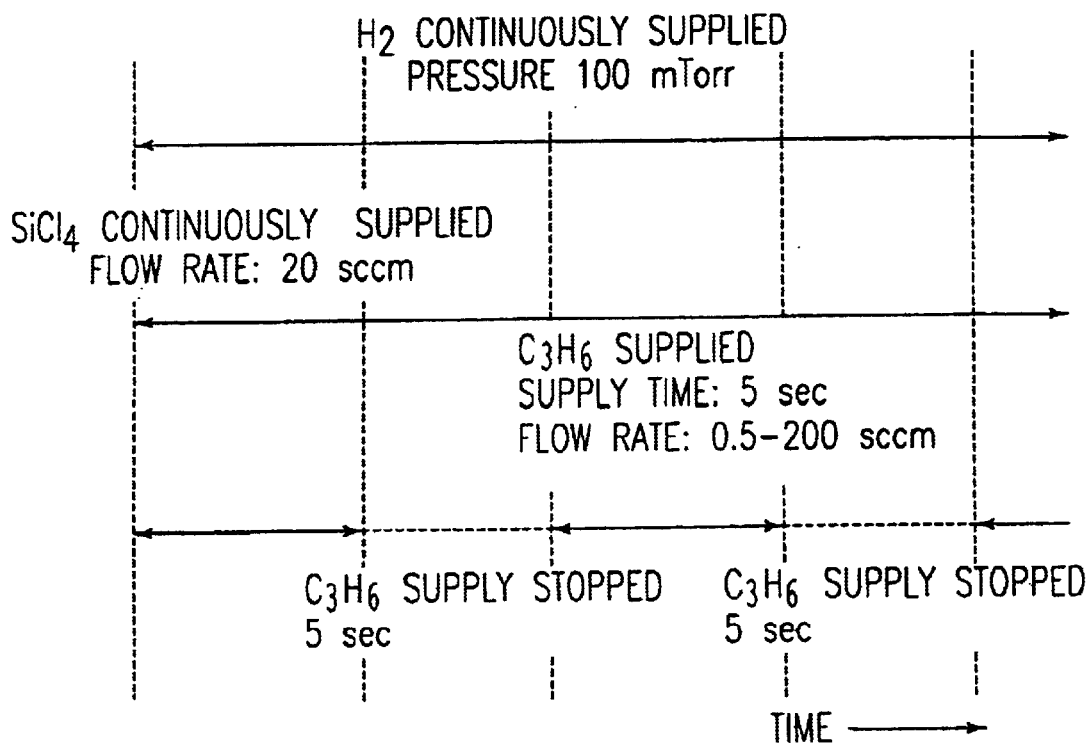

CHANGE OVER TIME (RELATIVE VALUE) OF NUMBER OF MOLECULES DESORBED FROM SUBSTRATE AS MEASURED BY QUADRUPOLE MASS SPECTROMETRY

METHOD OF MANUFACTURING SILICON CARBIDE, SILICON CARBIDE, COMPOSITE MATERIAL, AND SEMICONDUCTOR ELEMENT

BACKGROUND OF THE INVENTION

1. Field of the Invention

The present invention relates to methods of manufacturing silicon carbide (for example, thin films and ingots) employed as a substrate material in semiconductor devices and X-ray masks, chiefly silicon carbide employed in the components of semiconductor manufacturing devices, dummy wafers employed in semiconductor element manufacturing steps, and silicon carbide structural members (for example, heaters, anticorrosion products (screws, bearings), and the like).

2. Related Art

Silicon carbide is a semiconductor with a broad forbidden bandwidth of 2.2 eV or greater and is a thermally, chemically, and mechanically stable crystal. Further, due to high thermal conductivity, its application as a semiconductor material under conditions of high frequency, high power, high temperature, and the like is anticipated.

Methods of manufacturing silicon carbide include reacting coke and silicon on a heated carbon surface and precipitating silicon carbide on a carbon surface (the Atchison method); heating and sublimating silicon carbide formed by the Atchison method and recrystallizing it (sublimation method, improved Reilly method); the liquid deposition method in which silicon is melted in a carbon crucible and the suspended carbon and silicon are reacted in the crucible while drawing the product upward; and the like.

Methods of manufacturing silicon carbide include reacting coke and silicon on a heated carbon surface and precipitating silicon carbide on a carbon surface (the Acheson method): heating and sublimating silicon carbide formed by the Acheson method and recrystallizing it (sublimation method, improved Lely method): the liquid deposition method in which silicon is melted in a carbon crucible and the suspended carbon and silicon are reacted in the crucible while drawing the product upward: and the like.

Although the Acheson method produces inexpensive, large quantities of silicon carbide, the precipitating silicon carbide is amorphous, comprising crystalline polymorphism and large quantities of impurities. In particular, this method cannot be employed to manufacture semiconductor materials in which defects and impurities are problematic.

The improved Lely method reduces the problems of crystalline polymorphism. amorphism, and the like associated with the Acheson method. However, it is difficult to reduce the impurities incorporated into the crystal, and increasing the area of the crystal and decreasing the number of defects are no simple tasks.

The method that is generally employed to reduce the crystal defects and impurities that are problematic in the improved Lely method is to use CVD or ALE to epitaxially grow silicon carbide while reducing the defect density and impurities on a silicon carbide substrate obtained by the improved Lely method. However, since the area of the crystals obtained by these methods is limited to the area of the silicon carbide obtained by the improved Lely method, large-area. high quality silicon carbide cannot be obtained.

To increase the area of silicon carbide, the general method has been devised of using CVD of ALE to heteroepitaxially grow a silicon carbide layer on a single crystal silicon substrate employed as a semiconductor material. However, high concentrations of defects are produced at the interface of the silicon substrate and the silicon carbide. Thus, the quality of the crystal is poorer than that of epitaxially grown silicon carbide layers formed on silicon carbide substrates obtained by the improved Lely method. When employing heteroepitaxial growth, crystal quality can be improved by increasing the thickness of the film of silicon carbide being grown. However, since the rate of silicon carbide growth by CVD of ALE is extremely low, the application of silicon carbide obtained by heteroepitaxial growth is currently impeded.

The rate of growth of silicon carbide can be increased to some extent by increasing the partial pressure of the starting gasses using CVD. However, the faster the growth rate, the more crystal defects tend to increase in the silicon carbide. Since the ALE method requires that a certain quantity of atoms or molecules be uniformly adsorbed to the substrate surface under thermal equilibrium, increasing the growth rate of silicon carbide by increasing the amount of gas being fed as is done in CVD is undesirable.

Accordingly, the object of the present invention is to provide a method of manufacturing silicon carbide affording adequate ease of production by increasing the growth rate of silicon carbide in gas vapor growth without increasing crystal defects.

That is, for example, a further object of the present invention is to provide a method of manufacturing silicon carbide of a quality suitable for use as a semiconductor element material with fewer crystal defects and affording adequate ease of production even in heteroepitaxial growth employing a substrate other than silicon carbide. A further object of the manufacturing method of the present invention is to obtain silicon carbide not just as a thin film, but also as an ingot or structural member.

A still further object of the present invention is to provide silicon carbide (not just thin films, but also ingots and structural members) having heretofore unseen dimensions (bores) in the form of silicon carbide of a quality suitable for use as a semiconductor element material with reduced crystal defects.

Yet another object of the present invention is to provide a semiconductor element employing the above-described silicon carbide as a substrate, and to provide a method of manufacturing composite materials employing the above-described silicon carbide as seed crystal.

SUMMARY OF THE INVENTION

The aforementioned objects can be achieved by the present invention as follows.

In accordance with the present invention, there is provided a method of manufacturing silicon carbide by forming silicon carbide from an atmosphere containing a silicon carbide feedstock gas on a substrate surface, characterized in that:

said silicon carbide feedstock gas comprises at least a silicon source gas and a carbon source gas;

the partial pressure ps of said silicon source gas in said atmosphere is constant (with ps>0), the partial pressure of said carbon source gas in said atmosphere consists of a state of pc1 and a state pc2

(where pc1 and pc2 denote partial pressures of said carbon source gas, pc1>pc2, and the partial pressure ratio (pc1/ps) falls within a range of 1–10 times the sticking coefficient ratio (Sc/Sc), the partial pressure ratio (pc2/ps) falls within a range of less than one time the sticking coefficient ratio (Sc/Sc)

(where Sc denotes the sticking coefficient of silicon source gas to the silicon carbide substrate at the substrate temperature during formation of said silicon carbide, and Sc denotes the sticking coefficient of carbon source gas to the silicon carbide substrate at the substrate temperature during the forming of said silicon carbide))

that are repeated in alternating fashion (referred to as condition 1 below); or the partial pressure ps of said silicon source gas in said atmosphere is constant (with ps>0), the partial pressure of said carbon source gas in said atmosphere consists of a state of pc1 and a state pc2

(where pc1 and pc2 denote partial pressures of said carbon source gas, pc1>pc2, and the partial pressure ratio (pc1/ps) falls within a range of 1–10 times the sticking coefficient ratio (Sc/Sc), the partial pressure ratio (pc2/ps) falls within a range of less than one time the sticking coefficient ratio (Sc/Sc)

(where Sc denotes the sticking coefficient of silicon source gas to the silicon carbide substrate at the substrate temperature during formation of said silicon carbide, and Sc denotes the sticking coefficient of carbon source gas to the silicon carbide substrate at the substrate temperature during the forming of said silicon carbide))

the partial pressure ps of said silicon source gas in said atmosphere is constant (with ps>0). the partial pressure of said carbon source gas in said atmosphere consists of a state of pc1 and a state pc2

(where ps1 and ps2 denote partial pressures of said silicon source gas, ps1>ps2, and the partial pressure ratio (pc/ps1) falls within a range of 1–10 times the sticking coefficient ratio (Sc/Sc), the partial pressure ratio (pc/ps2) falls within a range of less than one time the sticking coefficient ratio (Sc/Sc)

(where Sc denotes the sticking coefficient of silicon source gas to the silicon carbide substrate at the substrate temperature during formation of said silicon carbide, and Sc denotes the sticking coefficient of carbon source gas to the silicon carbide substrate at the substrate temperature during the forming of said silicon carbide))

that are repeated in alternating fashion (referred to as condition 2 below).

In the above manufacturing method of silicon carbide, the followings are preferred.

In condition 1, pc1 and pc2 each continue for a prescribed period, and in condition 2, ps1 and ps2 each continue for a prescribed period.

Silicon carbide is formed on a substrate the temperature of which is not less than 900° C.

The above silicon source gas is at least one member selected from the group consisting of $SiH_4$, $Si_2H_6$, $SiCl_4$, $SiHCl_3$, $SiH_2Cl_2$, $Si(CH_3)_4$, $SiH_2(CH_3)_2$, $SiH(CH_3)_3$, and $Si_2(CH_3)_6$, and said carbon source gas is at least one member selected from the group consisting of $CH_4$, $C_3H_8$, $C_2H_5$, $C_2H_6$, $C_2H_2$, $C_2H_4$, $CCl_4$, $CHF_3$, and $CF_4$.

Pc2 or ps1 is essentially 0.

Pc2 is essentially 0, the time during which the partial pressure of the carbon source gas is set to pc1 is 0.1–30 seconds, and the time during which the partial pressure of the carbon source gas is set to pc2 is 0.1–30 seconds.

The present invention further relates to a method of manufacturing silicon carbide characterized in that the silicon carbide manufactured in any of claims 1–6 is employed as seed crystal and in that silicon carbide is formed on said seed crystal by vapor phase epitaxy. sublimation recrystallization, or liquid phase epitaxy.

In the above manufacturing method of silicon carbide, the preferred is that silicon carbide blocks 4–6 inches are formed by vapor phase epitaxy, sublimation recrystallization, or liquid phase epitaxy.

The present invention further relates to a silicon carbide block characterized by having a bore of 4–6 inches.

In the above silicon carbide block, the preferred is that the planar defect density is not more than $10^3/cm^2$.

The present invention further relates to a semiconductor element employing as substrate the silicon carbide block described above.

The present invention further relates to a method of manufacturing composite materials characterized in that silicon carbide manufactured by the above-mentioned method is employed as seed crystal and diamond and/or gallium nitride is formed on said seed crystal.

BRIEF DESCRIPTION OF THE DRAWINGS

FIG. 4 is the method of supplying feedstock gas in Comparative Example 1.

FIG. 5 is the method of supplying feedstock gas in Embodiment 1.

FIG. 6 is the method of supplying feedstock gas in Embodiment 2.

FIG. 7 is the method of supplying feedstock gas in Embodiment 3.

DETAILED DESCRIPTION OF THE PREFERRED EMBODIMENTS

The method of manufacturing silicon carbide of the present invention is chiefly a method of manufacturing thin films of silicon carbide on a substrate surface from an atmosphere containing silicon carbide feedstock gases. However, it is not limited to thin films of silicon carbide, and can be used to manufacture silicon carbide ingots and structural members of silicon carbide.

The method of manufacturing silicon carbide of the present invention is characterized by conditions 1 and 2 below.

Condition 1: The silicon carbide feedstock gas comprises at least a silicon source gas and a carbon source gas. The partial pressure ps of the silicon source gas in the atmosphere is constant (with ps>0), and the partial pressure of the carbon source gas repeatedly alternates between a state pc1 and a state pc2.

Condition 2: The silicon carbide feedstock gas comprises at least a silicon source gas and a carbon source gas. The partial pressure pc of the carbon source gas is constant (with pc>0), and the partial pressure of the silicon source gas repeatedly alternates between a state ps1 and a state ps2.

Figure 1:
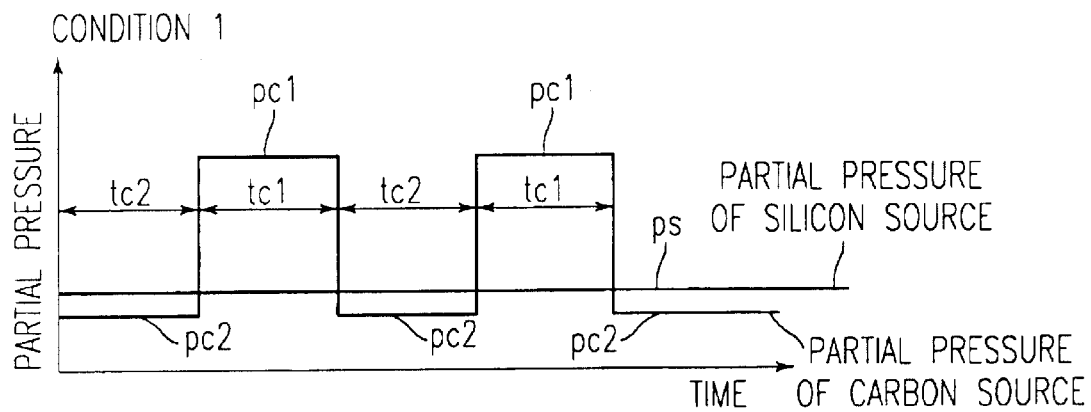
FIG. 1 is an example of the cycle of condition 1 of the present invention.

FIG. 1 shows an example of the cycle of condition 1.

In condition 1, the partial pressure ps of the silicon source gas is constant in the atmosphere. However, ps>0. The partial pressure of the carbon source gas in the atmosphere repeatedly alternates between a state pc1 and a state pc2. That is, since pc1>pc2, the partial pressure of the carbon source gas is increased. Although pc1>pc2, pc2 can essentially be 0. What is meant in the present Specification by the partial pressure being essentially 0 is not greater than $10^{-5}$ Torr. The time (tc1) during which the pressure of the carbon source gas is made pc1 and the time (tc2) during which the partial pressure of the carbon source gas is made pc2 are repeatedly alternated.

In condition 1, during time tc2 when the partial pressure of the carbon source gas is made pc2, the partial pressure of the carbon source gas is lower than the silicon source gas, and so long as pc2 is not zero, silicon carbide precipitates. However, Si also precipitates in this state. Subsequently, during time tc1 when the partial pressure of the carbon source gas is pc1, the partial pressure of the carbon source gas becomes relatively high, and simultaneously with the precipitation of silicon carbide, Si reacts with C supplied by the silicon source gas, creating silicon carbide. To permit the creation of such states, tc1 and tc2, ps, pc1 and pc2, the type of silicon source gas and carbon source gas, the substrate temperature, the capacity of the reaction vessel, and the like are considered and suitably determined. For example, tc1 can be set to within a range of 0.1–60 sec and tc2 to within a range of 0.1–90 sec. Setting pc2 to 0; setting time tc1, when the partial pressure of the carbon gas is set to pc1, to 0.1–30 sec; and setting time tc2, when the partial pressure of the carbon source gas is set to pc2, to 0.1–30 sec is particularly desirable from the viewpoint of decreasing crystal defects in the silicon carbide and increasing the growth rate.

Further, in condition 1, the partial pressure ratio (pc1/ps) is set to within a range of 1–10 times the sticking coefficient ratio (Sc/Sc) and the partial pressure gas ratio (pc2/ps) is set to within a range of less than one time the sticking coefficient ratio (Sc/Sc). Thus, during time tc2 when the partial pressure of the carbon source gas is pc2, silicon carbide and Si precipitate simultaneously, and subsequently, during time tc1 when the partial pressure of the carbon source gas is pc1, the precipitation of silicon carbide and the formation of silicon carbide through the reaction of precipitated Si and C occur simultaneously. The sticking coefficient ratio (Sc/Sc) can be calculated by a method described further below.

Figure 2:
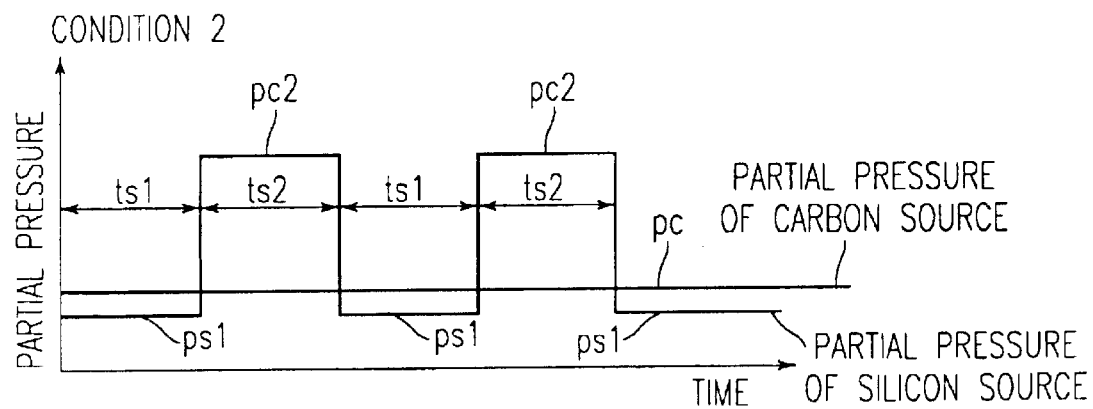
FIG. 2 is an example of the cycle of condition 2 of the present invention.
Figure 3A:
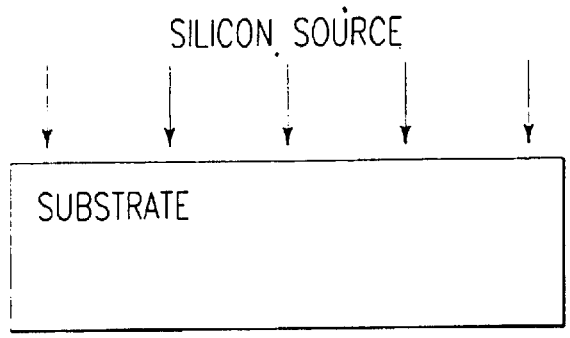
FIG. 3 is a type drawing descriptive of the operation of the present invention: (1) shows how the silicon source is fed onto the substrate, (2) shows how the silicon source fed onto the substrate forms an epitaxial growth layer of silicon, (3) shows how the epitaxial growth layer of silicon formed on the substrate reacts with the carbon source to form silicon carbide, and (4) shows how the carbon source forms an adsorption layer on the silicon carbide layer, impeding adsorption of the silicon source.
Figure 3B:
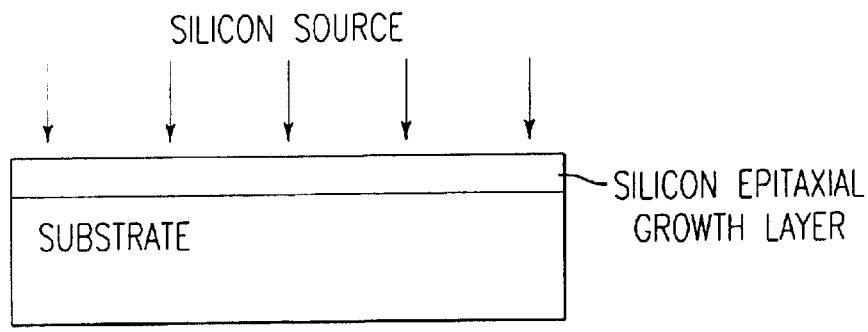
Figure 3C:
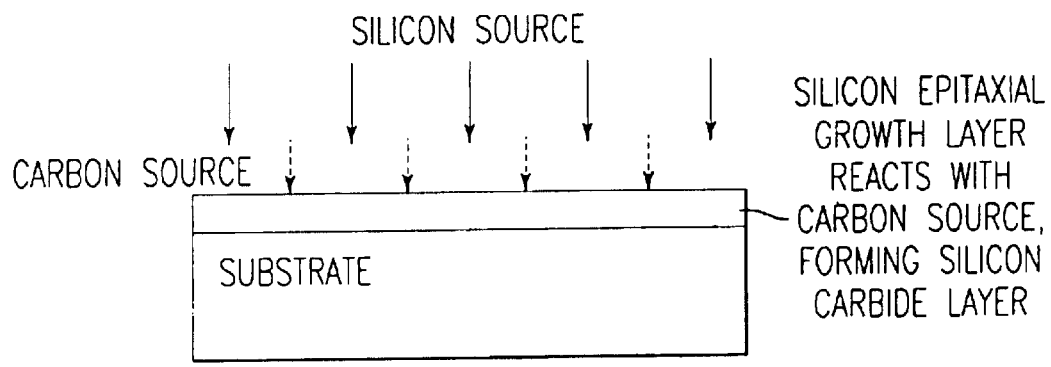
Figure 3D:
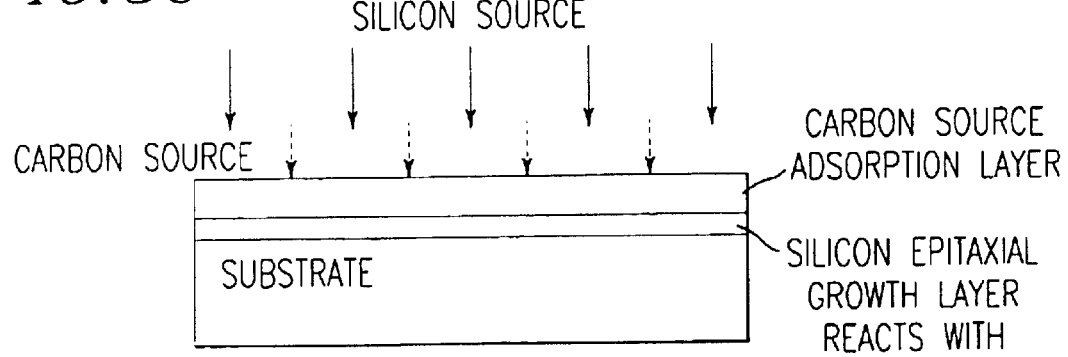

An example of the cycle of condition 2 is shown in FIG. 2.

In condition 2, the partial pressure pc of the carbon source gas in the atmosphere is held constant. However, pc>0. The state where the partial pressure of the silicon source gas in the atmosphere is ps1 and the state in which it is ps2 are repeatedly alternated. That is, since ps1<ps2, the partial pressure of the silicon source gas is increased. Although ps1<ps2, ps1 can be essentially 0. The time (ts1) during which the partial pressure of the silicon source gas is made ps1 and the time (ts2) during which the partial pressure of the silicon gas source is made ps2 are repeatedly alternated.

In condition 2, during time ts2 when the partial pressure of the silicon source gas is made ps2, the partial pressure of the carbon source gas is lower than that of the silicon source gas and silicon carbide precipitates, but Si also precipitates during that state. Subsequently, during time ts1 when the partial pressure of the silicon source gas is made ps1, the partial pressure of the silicon source gas becomes relatively low, and Si reacts with C supplied by the carbon source gas to form silicon carbide simultaneously with the precipitation of silicon carbide. To permit the creation of such states, ts1 and ts2, pc, ps1 and ps2, the type of silicon source gas and carbon source gas, the substrate temperature, the capacity of the reaction vessel, and the like are considered and suitably determined. For example, ts1 can be set to within a range of 0.1–60 sec and ts2 to within a range of 0.1–60 sec.

Further, in condition 2, partial pressure ratio (pc/ps1) is set to within a range of 1–10 times the sticking coefficient ratio (Sc/Sc), and partial pressure ratio (pc/ps2) is set to within a range of less than one time the sticking coefficient ratio (Sc/Sc). Thus, during time ts2 when the partial pressure of the silicon source gas is ps2, precipitation of silicon carbide and Si occurs precipitate simultaneously, and subsequently, during time ts1 when the partial pressure of the silicon source gas is ps1, precipitation of silicon carbide and the formation of silicon carbide through the reaction of precipitated Si and C occur simultaneously.

Sticking coefficient ratio (Sc/Sc) can be determined in the following manner.

A valve is used to blow a pulse of either the carbon source gas or the silicon source gas onto the surface of the silicon carbide substrate. The temperature of the silicon carbide substrate is preset to the substrate temperature for forming silicon carbide.

The partial pressure at T=0 is instantaneously raised to a fixed level.

Figure 10:
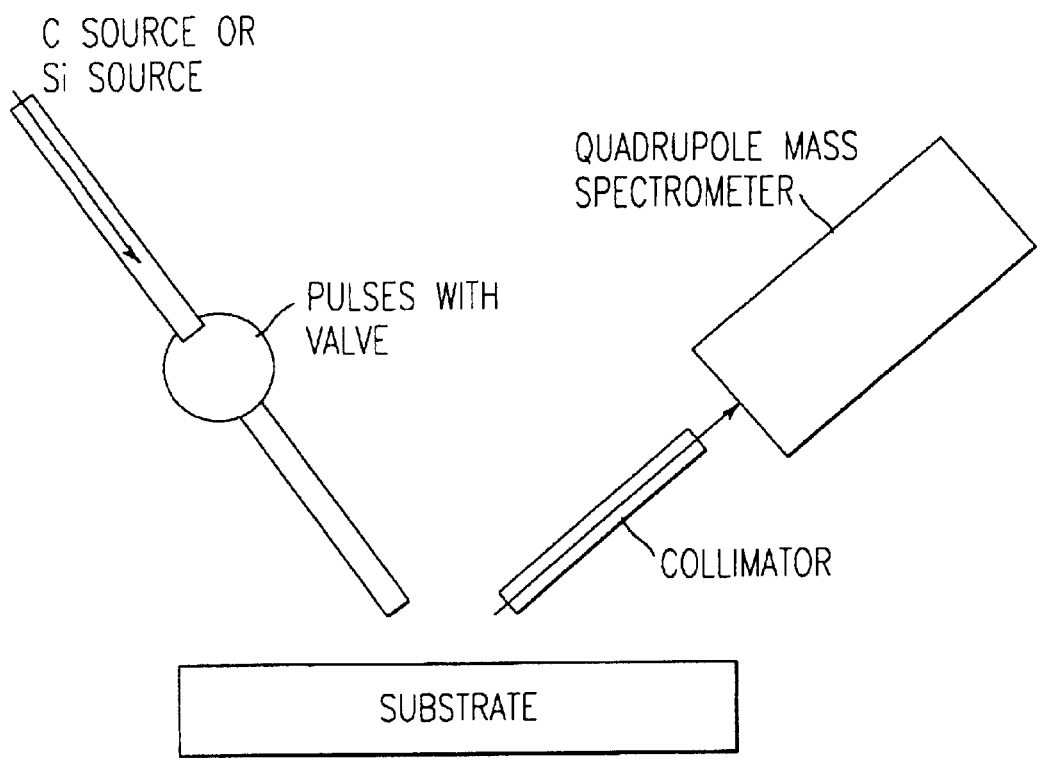
FIG. 10 is a schematic drawing of the method used to measure the attachment coefficient ratio.

Gas molecules temporarily attached to the surface of the substrate are desorbed, but the quantity (a relative value) of the gas molecules that are desorbed is monitored with a quadrupole mass spectrometer. A collimator is positioned between the substrate and the quadrupole mass spectrometer so that in this process, just the gas molecules that are desorbed from the substrate enter the mass spectrometer. (FIG. 10 is a schematic of the measurement system.)

Figure 11:
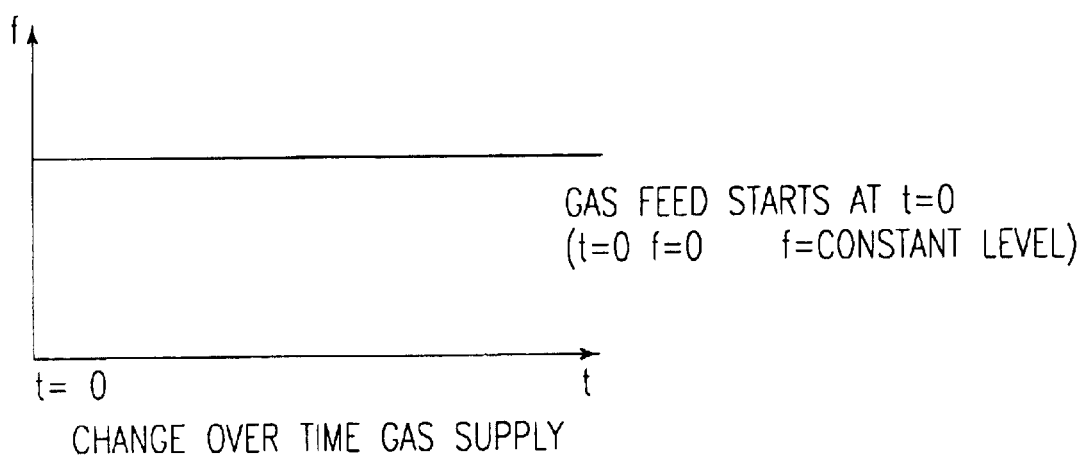
FIG. 11 is a graph showing the change over time of the quantity of gas that is fed.
Figure 12:
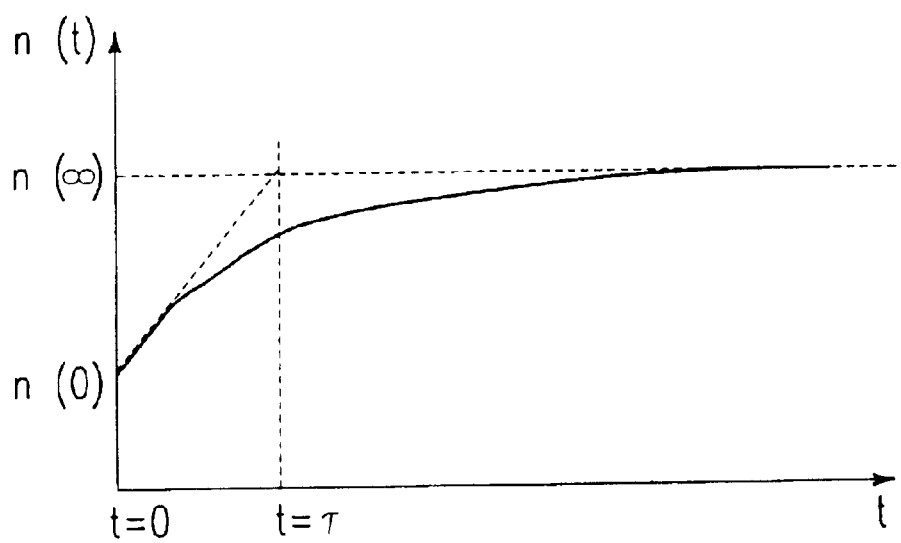
FIG. 12 is a graph showing the change over time of the number n(t) (relative value) of gas molecules desorbing from the substrate surface as measured by quadrupole mass spectrometry.

The graph of FIG. 11 shows the change over time of the level of gas supply. The graph of FIG. 12 shows the change over time in the quantity n(t) (relative value) of gas molecules desorbed from the surface of the substrate being measured by the quadrupole mass spectrometer.

Let τ denote the time coordinates of the point of intersection of the tangent of n(t) when t=0 and the asymptotic line when τ→∞. Let τc (the average residence time of the carbon source gas on the surface of the substrate) denote τ when the gas employed is the carbon source gas. Let τs (the average residence time of the silicon source gas on the surface of the substrate) denote τ when the gas employed is the silicon source gas. The sticking coefficient ratio can then be calculated from the relation Sc/Ss=τ c/τ s.

During the formation of silicon carbide by the manufacturing method of the present invention, setting the substrate temperature to not less than 900° C. promotes the decomposition of molecules adhering to the substrate surface and promotes the reaction, and is suitable from the viewpoint of making it possible to establish a prescribed relation (the relation specified by condition 1 and condition 2) between the partial pressure ratio and the sticking coefficient ratio that is independent of the types of gas. The substrate temperature desirable falls with a range of 1,100–1,370° C.

Examples of substrates suitable for use in forming silicon carbide are Si, SiC, TiC, sapphire, and diamond.

The operation of the manufacturing method of the present invention will be described based on FIG. 3. FIG. 3 describes the case of condition 1.

As shown by FIG. 3(1), when a silicon source is continuously fed to the substrate surface (ps=constant, pc2=0), the silicon source thermally decomposes, for example, on the surface of the substrate that has been heated to not less than 900° C. and a single crystal of silicon forms on the substrate surface (FIG. 3(2)). Here, when the carbon source is temporarily supplied (at pc2), the formation of the silicon layer on the substrate surface is inhibited and the silicon layer that formed on the substrate surface prior to the introduction of the carbon source simultaneously reacts with the carbon source, forming silicon carbide (FIG. 3(3)). In this process, when the partial pressure of the carbon source has been set to pc2, the sticking coefficient of the carbon source to Sc, the partial pressure of the silicon source to ps, and the sticking coefficient of the silicon source to Ss, and when pc2 or ps is controlled to maintain a relation where pc2/ps during the carbon source supply is not less than one time and not more than ten times Ss/Sc, the incorporation of the silicon source onto the substrate surface is inhibited during feeding of the carbon source (FIG. 3(4)).

When the carbon source is fed intermittently as set forth above, the process of silicon layer epitaxial growth on the substrate surface and process of the formation of silicon carbide through the reaction of the silicon layer that has been epitaxially grown and the carbon source are completely separated in time, yielding single-crystal silicon carbide with few defects. Further, since the carbon source adsorption layer is segregated in the vicinity of the substrate surface during feeding of the carbon source in the present invention and the silicon source remains, as soon as feeding of the carbon source is stopped, the silicon layer grows epitaxially and the growth rate of the silicon carbide increases. However, when pc2/ps falls below Ss/Sc, the silicon source is incorporated into the substrate surface even during feeding of the carbon source, yielding silicon carbide in which there is a shift in crystal orientation with the underlayer, or microcrystals of silicon are picked up in the silicon carbide, precluding the effect of the present invention. To achieve adequate mass production (growth rate of silicon carbide) based on the present invention, the time during which the carbon source is fed per cycle is preferably not more than 30 sec. However, at less than 0.1 sec, it is difficult to supply an adequate carbon source. The interval of the intermittent supply of carbon source is desirably not less than 0.1 sec to desorb the carbon source that has adsorbed onto the substrate surface and to promote the growth of silicon on the substrate surface. However, at greater than 30 sec, the growth rate of the silicon carbide tends to be compromised.

Mechanism of deposition of silicon carbide and the like in condition 1 has been described above; that of condition 2 is substantially identical therewith.

Although the silicon source gas and the carbon source gas employed in the manufacturing method of the present method are not specifically limited, at least one member from among the group consisting of $SiH_4$, $Si_2H_6$, $SiCl_4$, $SiHCl_3$, $SiH_2Cl_2$, $Si(CH_3)_4$, $SiH_2(CH_3)_2$, $SiH(CH_3)_3$, and $Si_2(CH_3)_6$ can be employed as the silicon source gas, for example. Further, at least one member from among the group consisting of $CH_4$, $C_3H_8$, $C_2H_5$, $C_2H_6$, $C_2H_2$, $C_2H_4$, $CCl_4$, $CHF_3$, and $CF_4$ can be employed as the carbon source gas, for example.

Based on the method of manufacturing silicon carbide of the present invention as set forth above, large-bore silicon carbide with few (or no) crystal defects can be manufactured with good ease of production. In particular, even when the substrate is something other than silicon carbide—single crystal silicon, for example—it is possible to manufacture large-bore silicon carbide with few (or no) crystal defects with good ease of production.

The present invention covers methods of manufacturing silicon carbide characterized in that silicon carbide manufactured by the above-described manufacturing method of the present invention, particularly thin film silicon carbide, is employed as seed crystal, and silicon carbide is formed on this seed crystal by vapor phase epitaxy, sublimation recrystallization, or liquid phase epitaxy.

Vapor phase epitaxy, sublimation recrystallization, and liquid phase epitaxy methods for forming silicon carbide are as follows.

In vapor phase epitaxy methods of forming silicon carbide, at least two types of gas consisting of a carbon source and a silicon source, or at least one type of gas comprising both carbon and silicon, is thermally decomposed in a vapor phase or on the surface of the substrate and reacted, yielding silicon carbide on the substrate surface. For example, an SiC substrate based on the present invention is employed as seed crystal, and while being heated under vacuum to 1,200° C., 1 sccm of silane gas and 0.5 sccm of propane gas are introduced, and 1 slm of a noble gas in the form of Ar is fed. While maintaining the pressure of the reaction system at 100 mTorr, SiC is grown again on the seed crystal SiC substrate.

In sublimation recrystallization methods of forming silicon carbide, silicon carbide feedstock is charged to a graphite crucible, a seed crystal of the silicon carbide of the present invention is introduced opposite the feedstock, and while controlling the temperature of the feedstock to be somewhat higher than that of the seed crystal, the crucible is heated to not less than 2,000° C. at one atmospheric pressure, causing the feedstock to sublimate and recrystallize on the seed crystal.

In liquid deposition methods of forming silicon carbide, Si is melted in a carbon crucible heated to 1,500° C., the surface of the silicon carbide (seed crystal) of the present invention is contacted with the liquid surface, and silicon carbide grows on the seed crystal from molten Si and suspended carbon in the molten Si.

Silicon carbide blocks (for example, ingots and structural members) with bores of from 4–6 inches (ranging from 100–160 mm) can be formed by the above-described manufacturing methods (vapor phase epitaxy, sublimation recrystallization, and liquid phase epitaxy). Here, the term "bore" corresponds to the diameter of the substrate employed in the above-described manufacturing methods. In conventional silicon carbide blocks, the bore runs up to about three inches, but based on the manufacturing method of the present invention, silicon carbide blocks with bores of 4–6 inches (equivalent to 102–152 mm, ranging from 100–160 mm) can be obtained. Further, the blocks obtained have planar defect densities of not more than $103/cm^2$.

Accordingly, the present invention covers silicon carbide blocks characterized by bores of from 4–6 inches. These silicon carbide blocks also have planar defect densities of not more than $10^3/cm^2$.

The present invention further covers semiconductor elements employing the above-described silicon carbide blocks of the present invention as substrates. Examples of such semiconductor elements are Schottky diodes, blue light-emitting diodes, and other power devices and light-emitting elements.

Further, these semiconductor elements can also be manufactured by methods of manufacturing composite materials including the formation of diamond and/or gallium nitride on seed crystals of silicon carbide manufactured by the above-described manufacturing method of the present invention, for example.

Diamond can be formed on the seed crystal in the following manner.

A seed crystal is placed in a vacuum chamber and heated to 500° C., after which propane gas is introduced into the vacuum chamber. The pressure within the chamber is then regulated to 10 mTorr with an evacuation system. Next, a high frequency of 13.56 MHz (200 W) is applied between the seed crystal and a flat electrode facing the seed crystal and a plasma is formed. The carbon decomposed by the plasma is deposited on the seed crystal and remains at the correct crystal position to form diamond on the seed crystal.

Further, the formation of gallium nitride on seed crystal can be performed as follows.

A silicon carbide (seed crystal) substrate obtained by the manufacturing method of the present invention is placed in a vacuum vessel and heated to 1040° C. Next, 10 slm of ammonia and 0.5 sccm of trimethylgallium are introduced into the reaction vessel, and while the various gases decompose on the seed crystal, a GaN forming reaction takes place at correct crystal position.

The present disclosure relates to the subject matter contained in Japanese Patent Application No. 2000-162048 filed on May 31, 2000, which is expressly incorporated herein by reference in its entirety.

[Embodiments]

Embodiments of the present invention are described below.

In the embodiments and comparative examples, the partial pressures of the silicon source gas and carbon source gas are proportional to the feed flow rates. Thus, the partial pressure ratio is equal to the flow rate ratio.

COMPARATIVE EXAMPLE 1

(Intermittent Feeding of Both Silicon Source and Carbon Source)

Employing the {101} plane of a single-crystal silicon substrate as the single-crystal growth substrate, the substrate was heated to a temperature of 1,200° C., and cubic silicon carbide was epitaxially grown on the upper layer thereof. Using a cold wall type CVD device, the pressure was adjusted through the introduction of Ar to a pressure of 100 mTorr during growth. The growth of silicon carbide on the silicon substrate was conducted by feeding feedstock gases in the form of $SiH_2Cl_2$ and $C_2H_2$. The ratio Ss/Sc of the sticking coefficients of $SiH_2Cl_2$ and $C_2H_2$ on the surface of the silicon carbide was 0.25.

A comparative example will be given next based on FIG. 4. Silicon carbide was grown by feeding $SiH_2Cl_2$ and $C_2H_2$ at separate times. $SiH_2Cl_2$ feeding was conducted continuously for 5 sec at a partial pressure of 10 sccm. Next, after stopping the feeding of gases other than Ar, $C_2H_2$ was fed for 5 sec.

After feeding $C_2H_2$ for 5 sec, the feeding of gases other than Ar was stopped, and $SiH_2Cl_2$ feeding was begun. This alternating feeding of gases was repeated 1,000 times, yielding a cubic silicon carbide film on the silicon substrate. Growing the silicon carbide took 5.56 hr. As a result of the growth, a 0.8 μm single crystal of silicon carbide was obtained on the silicon substrate. As a result, the growth rate of the silicon carbide was 0.144 μm/hr. However, surface defects such as anti phase boundaries and twin crystal bands were present on the surface of the silicon carbide at a density of $10^3/cm^2$.

Embodiment 1 (Continuous Feeding of Silicon Source, Intermittent Feeding of Carbon Source)

Employing the {001} plane of a single-crystal silicon substrate as the single-crystal growth substrate, the substrate was heated to a temperature of 1,200° C., and 3C-silicon carbide was epitaxially grown on the upper layer thereof. Using a cold wall type CVD device, the pressure was adjusted through the introduction of Ar to a pressure of 100 mTorr during growth. The growth of silicon carbide on the silicon substrate was conducted by feeding feedstock gases in the form of $SiH_2Cl_2$ and $C_2H_2$. The ratio Ss/Sc of the sticking coefficients of $SiH_2Cl_2$ and $C_2H_2$ on the surface of the silicon carbide was 0.25.

The embodiment of the present invention will be described based on FIG. 5. While continuously feeding $SiH_{21Cl2}$ at a partial pressure of 10 sccm, $C_2H_2$ was intermittently fed to crow silicon carbide. The partial pressure of the $SiH_2Cl_2$ was 10 sccm. $C_2H_2$ was intermittently fed 1,000 times at intervals of 5 sec at a partial pressure of 10 sccm. Each time, the $C_2H_2$ was fed for 5 sec. Growth of silicon carbide required 2.8 hour. As a result of the growth, 67 μm of single crystal silicon carbide was obtained on the silicon substrate. The effective growth rate of silicon carbide was 24 μm/hr. Further, surface defects such as anti phase boundaries and twin crystal bands had been eliminated from the surface of the crystal obtained. In this manner, the use of the present invention permitted an accelerated rate of silicon carbide growth exceeding 10 μm/hr and permitted a substantial decrease in crystal defects. (fc1/fs=4xSs/Sc, fc2=0, that is pc1/ps=4xSx/Sc, pc2=0).

Although a cold wall CVD device was employed in the present embodiment, a hot wall type CVD device may also be employed to achieve results identical to those of the present embodiment.

Further, although the silicon {001} plane was employed as substrate, the same rapid growth and crystal properties as in the present embodiment can be achieved using the silicon {111} plane, cubic silicon carbide {001} plane, cubic silicon carbide {111} plane, cubic silicon carbide {−1, −1, −1} plane, hexagonal silicon carbide {1, 1, −2, 0} plane, hexagonal silicon carbide {0, 0, 0, 1} plane, hexagonal silicon carbide {0,0,0,−1} plane, and hexagonal silicon carbide {1, −10, 0} plane.

Although $C_2H_2$ was employed as the carbon source and $SiH_2Cl_2$ as the silicon source in the present embodiment, so long as the partial pressure ratio (flow rate ratio) of the carbon source to the silicon source is not less than one time and not more than ten times the attachment coefficient ratio, at least one member selected from the group consisting of $CH_4$, $C_3H_8$, $C_2H_5$, $C_2H_6$, $C_2H_4$, $C_2H_6$, $CCl_4$, $CHF_3$, and $CF_4$ can be employed as the carbon source, and at least one member selected from the group consisting of $SiH_4$, $Si_2H_6$, $SiCl_4$, $SiHCl_3$, $Si(CH_3)_4$, $SiH_2(CH_3)_2$, $SiH(CH_3)_3$, and $Si_2(CH_3)_6$ can be employed as the carbon source to achieve the effect of the present invention.

Embodiment 2 (Continuous Supply of Silicon, Intermittent Supply of Carbon)

Employing the {001} plane of a single-crystal silicon substrate as the single-crystal growth substrate, the substrate was heated to a temperature of 1,200° C., and 3C-silicon carbide was epitaxially grown on the upper layer thereof. Using a cold wall type CVD device, the pressure was adjusted through the introduction of Ar to a pressure of 100 mTorr during growth. The growth of silicon carbide on the silicon substrate was conducted by feeding feedstock gases in the form of $SiH_2Cl_2$ and $C_2H_2$. The ratio Ss/Sc of the attachment coefficients of $SiH_2Cl_2$ and $C_2H_2$ on the surface of the silicon carbide was 0.25.

The embodiment of the present invention will be described based on FIG. 6 below. While continuously feeding $SiH_2Cl_2$ at a flow rate of 10 sccm, $C_2H_2$ was intermittently fed to grow silicon carbide. The $SiH_2Cl_2$ flow rate was a constant 10 sccm. $C_2H_2$ was intermittently fed 1,000 times at intervals of 5 sec. Each time, $C_2H_2$ was fed for 5 sec. However, the flow rate fc of $C_2H_2$ was treated as a parameter and fc2 was varied from 0.5–200 sccm and the change in silicon carbide growth was observed. (fc1/fs=4xSs/Sc, fc2=0, that is pc1/ps=4xSx/Sc, pc2=0).

Table 1 shows the changes in growth rates of silicon carbide by fc1. When fc1/fs (that is, pc1/ps) was Ss/Sc (0.25) or greater, the growth rate of silicon carbide exceeded 10 μm/hr and the effect of the present invention was apparent. However, when fc1/fs (that is, pc1/ps) was less than Ss/Sc (0.25), not only did the growth rate of silicon carbide decrease, but silicon precipitated in the silicon carbide, precluding the effect of the present invention. Further, when fc1/fs (that is, pc1/ps) exceeded 2.5, the level of adsorption of $C_2H_2$ on the substrate surface increased. Since adsorption of $SiH_2Cl_2$ was blocked, the growth rate of silicon carbide dropped precipitously, precluding the effect of the present invention. Silicon carbide grown at an fc1/fs of not less than 0.5 and not greater than 3.5 did not exhibit surface defects such as anti phase boundaries and twin crystals.

As set forth above, the use of the method of manufacturing silicon carbide provided by the present invention yields a silicon carbide growth rate of 10 μm/hr or greater and improves quality.

TABLE 1

| fc1 (sccm) | fc1/fs (pc1/ps) | silicon carbide growth rate (μm/hr) |
| --- | --- | --- |
| 0.5 | 0.05 | silicon precipitation |
| 1 | 0.1 | silicon precipitation |
| 1.5 | 0.15 | 5 |
| 1.7 | 0.17 | 5 |
| 2 | 0.2 | 7 |
| 2.3 | 0.23 | 8 |
| 2.5 | 0.25 | 11 |
| 3 | 0.3 | 21 |
| 4 | 0.4 | 23 |
| 5 | 0.5 | 24 |
| 10 | 1 | 24 |
| 15 | 1.5 | 18 |
| 20 | 2 | 13 |
| 25 | 2.5 | 13 |
| 30 | 3 | 5 |
| 35 | 3.5 | 3 |
| 40 | 4 | 0.5 |
| 50 | 5 | 0 |
| 100 | 10 | 0 |
| 200 | 20 | 0 |

Although a cold wall type CVD device was employed in the present embodiment, the same effects can be achieved in the present embodiment using a hot wall type CVD advice.

Further, although the silicon {001} plane was employed as substrate, the same rapid growth and crystal properties as in the present embodiment can be achieved using the silicon {111} plane, cubic silicon carbide {001} plane, cubic silicon carbide {111} plane, cubic silicon carbide {-1, -1, -1} plane, hexagonal silicon carbide {1,1,-2,0} plane, hexagonal silicon carbide {0, 0, 0, 1} plane, hexagonal silicon carbide {0, 0, 0,-1} plane, and hexagonal silicon carbide {1, -10, 0} plane.

Although $C_3H_2$ was employed as the carbon source and $SiH_2Cl_2$ as the silicon source in the present embodiment, so long as the partial pressure ratio (flow rate ratio) of the carbon source to the silicon source is not less than once and not more than ten times the attachment coefficient ratio, at least one member selected from the group consisting of $CH_4$, $C_3H_8$, $C_2H_6$, $C_2H_2,C_3H_6$, $CCl_4$, $CHF_3$ and $CF_4$ can be employed as the carbon source, and at least one member selected from the group consisting of $SiH_4$, $Si_2H_6$, $SiCl_4$, $SiHCl_3$, $Si(CH_3)_4$, $SiH_2(CH_3)_2$, $SiH(CH_3)$ and $Si_2(CH_3)_6$ can be employed as the silicon source to achieve the effect of the present invention.

Embodiment 3

Employing the {001} plane of a single-crystal silicon substrate as the single-crystal growth substrate, the substrate was heated to a temperature of 1,300° C., and cubic silicon carbide was epitaxially grown on the upper layer thereof. Using a cold wall type CVD device, the pressure was adjusted through the introduction of $H_2$ to a pressure of 60 mTorr during growth. The growth of silicon carbide on the silicon substrate was conducted by feeding feedstock gases in the form of $SiCl_4$ and $C_3H_6$. The ratio Ss/Sc of the attachment coefficients of $SiCl_4$ and $C_3H_6$ on the surface of the silicon carbide was 0.68.

The embodiment of the present invention will be described based on FIG. 7 below. While continuously feeding $SiCl_4$ at a flow rate of 20 sccm, $C_3H_6$ was intermittently fed to grow silicon carbide. $C_2H_6$ was fed 1,000 times at intervals of 5 sec, each time lasting 5 sec. However, the flow rate fc of $C_3H_6$ was treated as a parameter and fc1 was varied from 0.5–200 sccm and the change in silicon carbide growth was observed (fc2=0, that is. pc2=0).

Table 2 shows the changes in growth rates of silicon carbide by fc1. When fc1/fs (that is, pc1/ps) was Ss/Sc (0.68) or greater, the growth rate of silicon carbide exceeded 10 μm/hr and the effect of the present invention was marked. However, when fc1/fs (that is, pc1/ps) was less than Ss/Sc (0.68), not only did the growth rate of silicon carbide decrease, but silicon precipitated in the silicon carbide, precluding the effect of the present invention. Further, when fc1/fs (that is, pc1/ps) exceeded 6.8, the level of adsorption of $C_2H_5$ on the substrate surface increased. Since adsorption of $SiCl_4$ was blocked, the growth rate of silicon carbide dropped precipitously, precluding the effect of the present invention.

Silicon carbide grown at an fc1/fs (that is, pc1/ps) of not less than 0.2 and not greater than 5 did not exhibit surface defects such as anti phase boundaries and twin crystals.

As set forth above, the use of the method of manufacturing silicon carbide provided by the present invention yields a silicon carbide growth rate of 10 μm/hr or greater and improves quality.

TABLE 2

| fc1 (sccm) | fc1/fs (pc1/ps) | silicon carbide growth rate (μm/hr) |
|---|---|---|
| 0.5 | 0.025 | silicon precipitation |
| 1 | 0.05 | silicon precipitation |
| 1.5 | 0.075 | silicon precipitation |
| 1.7 | 0.085 | silicon precipitation |
| 2 | 0.1 | 1.2 |
| 2.3 | 0.115 | 1.5 |
| 2.5 | 0.125 | 1.5 |
| 3 | 0.15 | 1.5 |
| 4 | 0.2 | 2.1 |
| 5 | 0.25 | 3.8 |
| 10 | 0.5 | 6.7 |
| 15 | 0.75 | 22 |
| 20 | 1 | 71 |
| 25 | 1.25 | 67 |
| 30 | 1.5 | 65 |
| 35 | 1.75 | 65 |
| 40 | 2 | 61 |
| 50 | 2.5 | 61 |
| 100 | 5 | 52 |
| 200 | 10 | 0 |

Although a cold wall type CVD device was employed in the present embodiment, the same effects can be achieved in the present embodiment using a hot wall type CVD device.

Further, although the silicon {001} plane was employed as substrate, the same rapid growth and crystal properties as in the present embodiment can be achieved using the silicon {111} plane, cubic silicon carbide {001} plane, cubic silicon carbide {111} plane, cubic silicon carbide {-1, -1, -1} plane, hexagonal silicon carbide {1,1,-2,0} plane hexagonal silicon carbide {0, 0, 0,1 } plane, hexagonal silicon carbide {0, 0, 0, 4} plane, and hexagonal silicon carbide {1, -10, 0} plane.

Although $C_3H_6$ was employed as the carbon source and $SiCl_4$ as the silicon source in the present embodiment, so long as the partial pressure ratio (flow rate ratio) of the carbon source to the silicon source is not less than one time and not more than ten times the attachment coefficient ratio, at least one member selected from the group consisting of $CH_4$, $C_3H_8$, $C_2H_2$, $C_2H_6$, $C_2H_4$, $C_3H_6$, $CCl_4$, $CF_3$ and $CF_4$ can be employed as the carbon source, and at least one member selected from the group consisting of $SiH_4$, $Si_2H_6$, $SiH_2Cl_2$, $SiHCl_3$, $SiH(CH_3)_4$, $SiH_2(CH_3)_2$, $SiH(CH_3)_3$, and $Si_2(CH_3)_6$ can be employed as the silicon source to achieve the effect of the present invention.

Embodiment 4

Employing the {001} plane of a single-crystal silicon substrate as the single-crystal growth substrate, the substrate was heated to a temperature of 1,200° C., and cubic silicon carbide was epitaxially grown on the upper layer thereof. Using a cold wall type CVD device, the pressure was adjusted through the introduction of Ar to a pressure of 100 mTorr during growth. The growth of silicon carbide on the silicon substrate was conducted by feeding feedstock gases in the form of $SiH_2Cl_2$ and $C_2H_2$. The ratio Ss/Sc of the sticking coefficients of $SiH_2Cl_2$ and $C_2H_2$ on the surface of the silicon carbide was 0.25.

Figure 8:
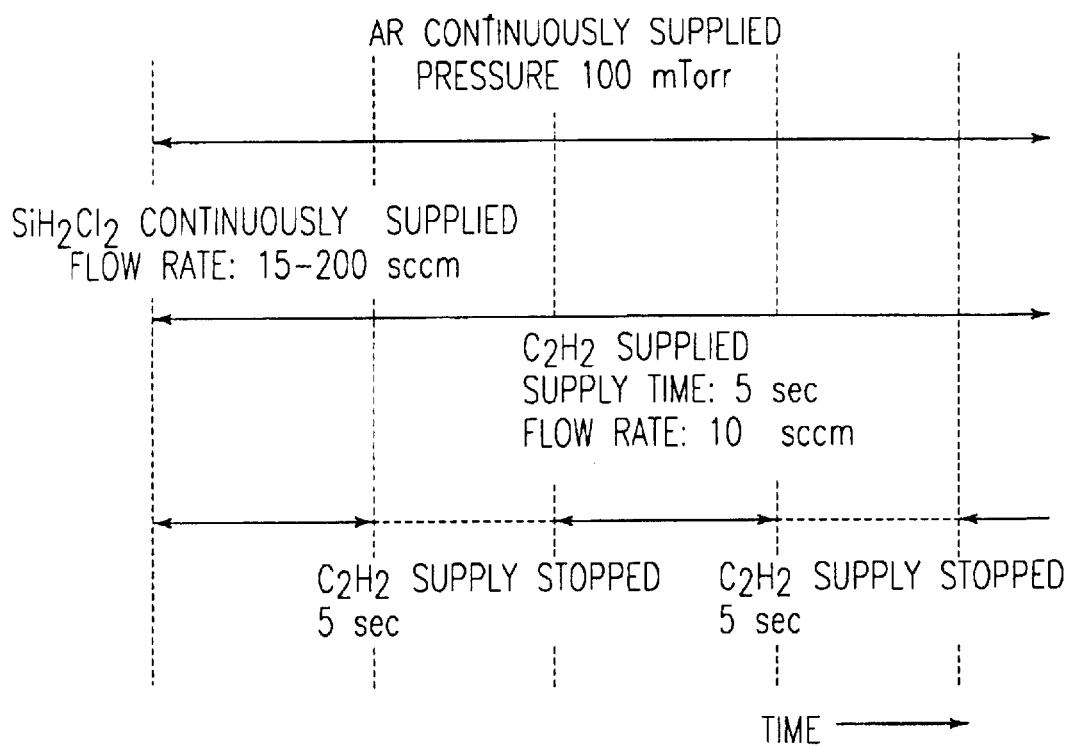
FIG. 8 is the method of supplying feedstock gas in Embodiment 4.

The embodiment of the present invention will be described based on FIG. 8 below. While continuously feeding $SiH_2Cl_2$, $C_2H_2$ was intermittently fed to grow silicon carbide. The $C_2H_2$ flow rate (fc1) was a constant 10 sccm (fc2=0, that is, pc2=0). $C_2H_2$ was intermittently fed 1,000 times at intervals of 5 sec for 5 sec each time. However, the flow rate fs of $SiH_2Cl_2$ was treated as a parameter and fs was varied from 15 sccm to 200 sccm and the change in silicon carbide growth rate was observed.

Table 3 shows the changes in growth rates of silicon carbide by fs. When fc1/fs (that is, pc1/ps) was Ss/Sc (0.25) or greater, the growth rate of silicon carbide exceeded 10 μm/hr and the effect of the present invention was apparent. However, when fc2/fs (that is, pc1/ps) was less than Ss/Sc (0.25), not only did the growth rate of silicon carbide decrease, but silicon precipitated in the silicon carbide, precluding the effect of the present invention. Further, when fc1/fs (that is, pc1/ps) exceeded 2.5, the level of adsorption of $C_2H_2$ on the substrate surface increased. Since adsorption of $SiH_2Cl_2$ was blocked, the growth rate of silicon carbide dropped precipitously, precluding the effect of the present invention.

Silicon carbide grown at an fc1/fs (that is, pc1/ps) of not less than 0.2 and not greater than 10 did not exhibit surface defects such as anti phase boundaries and twin crystals.

As set forth above, the use of the method of manufacturing silicon carbide provided by the present invention yields a silicon carbide growth rate of 10 μm/hr or greater and improves quality.

TABLE 3

| fc1 (sccm) | fc1/fs (pc1/ps) | silicon carbide growth rate (μm/hr) |
|---|---|---|
| 0.1 | 100 | 0 |
| 0.5 | 20 | 0 |
| 1 | 10 | 5 |
| 5 | 2 | 13 |
| 10 | 1 | 24 |
| 15 | 0.67 | 24 |
| 20 | 0.5 | 24 |
| 25 | 0.4 | 23 |
| 30 | 0.33 | 21 |
| 35 | 0.29 | 17 |
| 40 | 0.25 | 11 |
| 45 | 0.22 | 7 |
| 50 | 0.2 | 7 |
| 60 | 0.17 | 5 |
| 70 | 0.14 | 5 |
| 80 | 0.13 | Silicon precipitation |
| 90 | 0.11 | Silicon precipitation |
| 100 | 0.1 | Silicon precipitation |
| 150 | 0.067 | Silicon precipitation |
| 200 | 0.05 | Silicon precipitation |

Although a cold wall type CVD device was employed in the present embodiment, the same effects can be achieved in the present embodiment using a hot wall type CVD device.

Further, although the silicon {001} plane was employed as substrate, the same rapid growth and crystal properties as in the present embodiment can be achieved using the silicon {111} plane, cubic silicon carbide {001} plane, cubic silicon carbide {111} plane, cubic silicon carbide {-1, -1, -1} plane, hexagonal silicon carbide {1,1,-2,0} plane, hexagonal silicon carbide {0, 0, 0, 1} plane, hexagonal silicon carbide {0, 0, 0, -1} plane, and hexagonal silicon carbide {1, -10, 0} plane.

Although $C_2H_2$ was employed as the carbon source and $SiH_2Cl_2$ as the silicon source in the present embodiment, so long as the partial pressure ratio (flow rate ratio) of the carbon source to the silicon source is not less than one time and not more than ten times the attachment coefficient ratio, at least one member selected from the group consisting of $CH_4$, $C_3H_8$, $C_2H_6$, $C_2H_4$, $C_3H_6$, $CCl_4$, $CHF_3$, and $CF_4$ can be employed as the carbon source, and at least one member selected from the group consisting of $SiH_4$, $Si_2H_6$, $SiCl_4$, SiHCl$_3$, Si(CH$_3$)$_4$, SiH$_2$(CH$_3$)$_2$, SiH(CH$_3$)$_3$, and Si$_2$(CH$_3$)$_6$ can be employed as the carbon source to achieve the effect of the present invention.

Employing the {001} plane of a single-crystal silicon substrate as the single-crystal growth substrate, the substrate was heated to a temperature of 1,200° C., and cubic silicon carbide was epitaxially grown on the upper layer thereof. Using a cold wall type CVD device, the pressure was adjusted through the introduction of Ar to a pressure of 100 mTorr during growth. The growth of silicon carbide on the silicon substrate was conducted by feeding feedstock gases in the form of SiH$_2$Cl$_2$ and C$_2$H$_2$. The ratio Ss/Sc of the sticking coefficients of SiH$_2$Cl$_2$ and C$_2$H$_2$ on the surface of the silicon carbide was 0.25.

Figure 9:
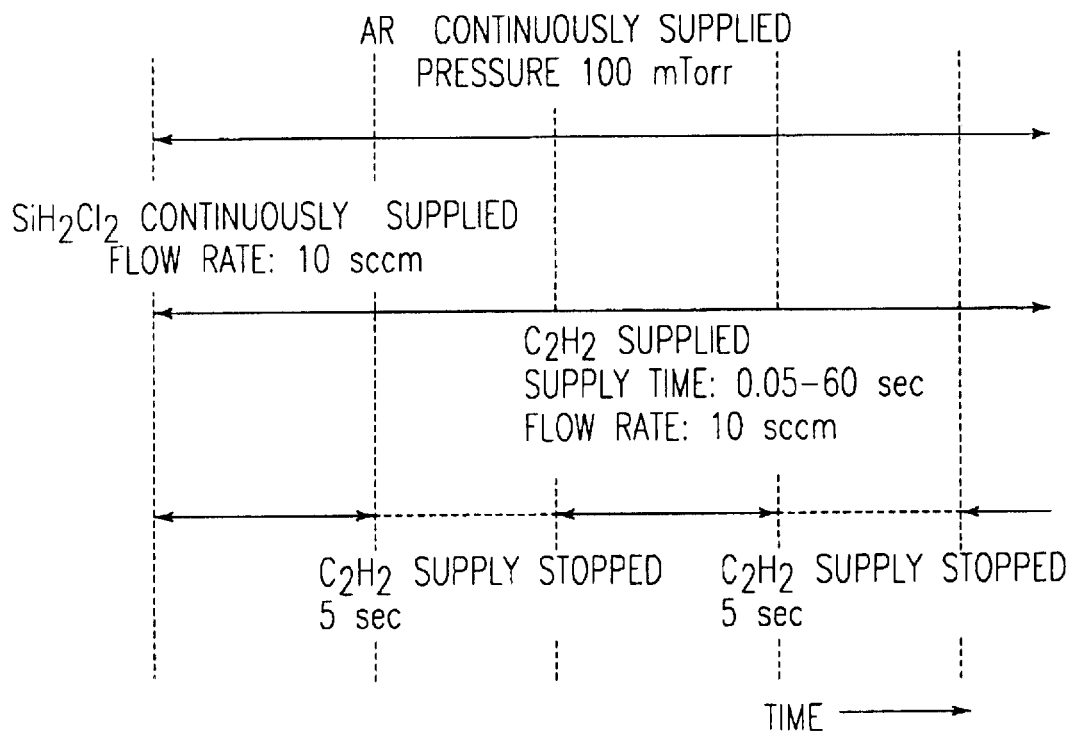
FIG. 9 is the method of supplying feedstock gas in Embodiment 5.

The embodiment of the present invention will be described based on FIG. 9 below. While continuously feeding SiH$_2$Cl$_2$, C$_2$H$_2$ was intermittently fed to grow silicon carbide. The SiH$_2$Cl$_2$ flow rate was a constant 10 sccm, and the C$_2$H$_2$ flow rate (fc1) was a constant 10 accm (fc2=0, that is pc2=0). C$_2$H$_2$ was repeatedly fed 1,000 times at intervals of 5 sec. However, the time during which C$_2$H$_2$ was fed each time, denoted as tc, was taken as a parameter and varied from 0 sec to 60 sec, and the change in silicon carbide growth rate was observed.

Table 4 shows the changes in growth rates of silicon carbide based on tc. When tc was less than 0.1 sec, although the growth rate of silicon carbide exceeded 10 $\mu$m/hr, the reaction between C$_2$H$_2$ and SiH$_2$Cl$_2$ was promoted in the vapor phase. Since the formation of silicon carbide was impeded at semicrystal positions, single crystal silicon carbide was not obtained. When tc exceeded 30 sec, the growth time of silicon carbide lengthened and the adsorption of C$_2$H$_2$ on the substrate surface inhibited the adsorption of SiH$_2$Cl$_2$, causing the growth rate of silicon carbide to drop below 10 $\mu$m/hr. Accordingly, the effect of the present invention appears at a tc of not less than 0.1 sec and not greater than 30 sec.

Silicon carbide grown at a tc of not less than 0.1 sec and not more than 45 sec did not exhibit surface defects such as anti phase boundaries and twin crystals.

As set forth above, the use of the method of manufacturing silicon carbide provided by the present invention yields a silicon carbide growth rate of 10 $\mu$m/hr or greater and improves quality.

TABLE 4

| tc (sec) | Growth rate of silicon carbide ($\mu$m/hr) | Crystal properties |
| --- | --- | --- |
| 0 | 87 | formation of silicon layer |
| 0.05 | 85 | polycrystal |
| 0.1 | 70 | single crystal |
| 0.5 | 69 | single crystal |
| 1 | 62 | single crystal |
| 3 | 64 | single crystal |
| 5 | 61 | single crystal |
| 8 | 58 | single crystal |
| 10 | 61 | single crystal |
| 15 | 40 | single crystal |
| 20 | 35 | single crystal |
| 25 | 21 | single crystal |
| 30 | 11 | single crystal |
| 35 | 7 | single crystal |
| 40 | 7 | single crystal |
| 45 | 5 | single crystal |
| 50 | 0 | |
| 60 | 0 | |

Although a cold wall type CVD device was employed in the present embodiment, the same effects can be achieved in the present embodiment using a hot wall type CVD device.

Further, although the silicon {001} plane was employed as substrate, the same rapid growth and crystal properties as in the present embodiment can be achieved using the silicon {111} plane, cubic silicon carbide {001} plane, cubic silicon carbide {111} plane, cubic silicon carbide {-1, -1, -1} plane, hexagonal silicon carbide {1, 1, -2, 0} plane, hexagonal silicon carbide {0, 0, 0, 1} plane, hexagonal silicon carbide {0,0,0,-1} plane, and hexagonal silicon carbide {1, -10, 0} plane.

Although C$_2$H$_2$ was employed as the carbon source and SiH$_2$Cl$_2$ as the silicon source of the present embodiment, so long as the partial pressure ratio (flow rate ratio) of the carbon source to the silicon source is not less than one time and not more than ten times the sticking coefficient ratio, at least one member selected from the group consisting of CH$_4$, C$_3$H$_8$, C$_2$H$_6$, C$_2$H$_6$, C$_3$H$_6$, CCl$_4$, CHF$_3$, and CF$_4$ can be employed as the carbon source, and at least one member selected from the group consisting of SiH$_4$, Si$_2$H$_6$, SiCl$_4$, SiHCl$_3$, Si(CH$_3$)$_4$, SiH$_2$(CH$_3$)$_2$, SiH(CH$_3$)$_3$, and Si$_2$(CH$_3$)$_6$ can be employed as the carbon source to achieve the effect of the present invention.

Embodiment 6

Seed crystals were prepared from the silicon carbides obtained in Embodiments 1–5 and silicon carbide was grown by vapor growth epitaxy on the surfaces of these seed crystals.

While heating a seed crystal in the form of an SiC substrate based on the present invention to 1,200° C. under vacuum, 1 sccm of silane gas and 0.5 sccm of propane gas were introduced, and 1 slm of a delution gas in the form of Ar was supplied. While maintaining the pressure in the reaction system at 100 mTorr, SiC was grown anew on the SiC seed crystal substrate. The seed crystal comprised cubic silicon carbide grown on a Si (001) substrate, and the silicon carbide that grew on the seed crystal was also cubic silicon carbide. The planar defect density of the seed crystal was 700/cm$^2$, while that of the newly grown surface decreased to 30/cm$^2$. Thus, it was possible to obtain extremely high quality silicon carbide of large (6 inch) bore.

In addition to the above-described vapor phase epitaxy, other methods such as sublimation recrystallization and liquid phase epitaxy can be employed to form silicon carbide on seed crystal.

Embodiment 7

The silicon carbide obtained in Embodiments 1–5 can be employed as seed crystal, upon which diamond, gallium nitride (GaN), or diamond and gallium nitride may be formed to obtain composite materials comprised of silicon carbide and diamond, composite materials comprised of silicon carbide and gallium nitride, and composite materials comprised of silicon carbide, diamond, and gallium nitride.

A seed crystal of cubic silicon carbide grown on an Si (001) substrate and prepared based on the present invention was placed in a vacuum chamber and heated to 500° C. Propane gas was then introduced into the vacuum chamber and the gas evacuation system was adjusted to generate a pressure within the chamber of 10 mTorr. Next, a 13.56 MHz high-frequency (200 W) was applied between the seed crystal and a flat electrode facing the seed crystal to form a plasma. Carbon decomposing due to the plasma was deposited on the seed crystal and kept in the proper crystal position, forming diamond on the seed crystal. The crystal orientation of the diamond surface was the (001) plane, as was that of the seed crystal, and the planar defect density decreased to 120/cm$^2$. Thus, it was possible to obtain extremely high quality diamond with a large (6 inch) bore.

Gallium nitride was also formed on a seed crystal in the following manner.

A substrate (seed crystal) of silicon carbide obtained by the manufacturing method of the present invention was placed in a vacuum chamber and heated to 1,040° C. Next, 10 slm of ammonia and 0.5 sccm of trimethylgallium were introduced into the reaction vessel, and while the gases decomposed over the seed crystal, GaN formed at the proper crystal position. The GaN that formed was, like the seed crystal, a cubic crystal the surface of which was the (001) plane. The planar defect density was 700/cm$^2$, identical to the seed crystal. Thus, it was possible to obtain extremely high quality GaN of large (6 inch) bore.

Since the crystal defects of silicon carbide employed as seed crystal are suppressed and various materials can be grown and formed on such seed crystals, it is possible to obtain high-quality silicon carbide materials and composite materials.

Further, gold and nickel electrodes were formed by the usual methods on a composite material consisting of diamond formed on the above-described silicon carbide to prepare Schottky barrier diodes.

Blue light emitting diodes were obtained using a composite material consisting of gallium nitride formed on the above-described silicon carbide.

Since a composite material formed using seed crystal in the form of silicon carbide with no crystal defects is employed in the Schottky barrier diodes and blue light emitting diodes, good characteristics can be achieved in semiconductor elements.

Thus, based on the present invention, it is possible to manufacture high-quality silicon carbide affording good ease of production since the rate of growth of silicon carbide can be increased without a corresponding increase in crystal defects.

Further, based on the present invention, silicon carbide and composite materials can be obtained in which crystal defects are suppressed.

What is claimed is:

1. A method of manufacturing a single crystal of silicon carbide, comprising:

forming a single crystal of silicon carbide on a substrate surface at a temperature of not less than 900° C. from a feedstock gas atmosphere consisting of a silicon source gas, a carbon source gas and optionally at least one carrier gas of hydrogen or a noble gas under the atmospheric condition of the partial pressure (ps) of the silicon source gas being held constant (at ps>0) and the partial pressure of the carbon source gas in the atmosphere repeatedly alternating between state pc1 present at an interval of time (tc1) and the state pc2 present at an interval of time (tc2) until the single crystal of silicon carbide is completely formed, where pc1>pc2 such that the partial pressure ratio (pc1/ps) falls within the range of 1–10 times the attachment coefficient ratio (Ss/Sc) and the partial pressure ratio (pc2/ps) falls within the range of less than one time the attachment coefficient ratio (Ss/Sc), wherein Ss denotes the attachment coefficient of silicon source gas to the silicon carbide substrate at the substrate temperature during formation of said silicon carbide and Sc denotes the attachment coefficient of carbon source gas to the silicon carbide substrate at the substrate temperature during the formation of said single crystal of silicon carbide.

2. The method of manufacture according to claim 1, wherein the silicon carbide is at least one member selected from the group consisting of $SiH_4$, $Si_2H_6$, $SiCl_4$, $SiHCl_3$, $SiH_2Cl_2$, $Si(CH_3)_4$, $SiH_2(CH_3)_2$, $SiH(CH_3)_3$ and $Si_2(CH_3)_6$ and said carbon source gas is at least one member selected from the group consisting of $CH_4$, $C_3H_8$, $C_2H_2$, $C_2H_6$, $C_2H_4$, $C_3H_6$, $CCl_4$, $CHF_3$ and $CF_4$.

3. The method of manufacture according to claim 1, wherein pc2 is essentially zero, the time interval (tc1) during which the partial pressure of the carbon source gas is set to pc1 is 0.1–30 seconds, and the time interval (tc2) during which the partial pressure of the carbon source gas is set to pc2 is 0.1–30 seconds.

4. A method of manufacturing silicon carbide, comprising:

forming a seed crystal of silicon carbide by the method of claim 1; and depositing silicon carbide on said seed crystal by vapor phase epitaxy, sublimation recrystallization or liquid deposition.

5. The method of manufacture according to claim 4, wherein silicon carbide blocks of 4–6 inch bore are formed by vapor phase epitaxy, sublimation recrystallization or liquid deposition.

6. A method of manufacturing composite materials, comprising:

forming a seed crystal of silicon carbide by the method of claim 1; and forming diamond and/or a gallium nitride structure on the seed crystal.

7. The method of manufacture according to claim 1, wherein the method of deposition is a CVD or ALE method.

8. A method of manufacturing a single crystal of silicon carbide, comprising:

forming a single crystal of silicon carbide on a substrate surface at a temperature of not less than 900° C. from a feedstock gas atmosphere consisting of a silicon source gas, a carbon source gas and optionally at least one carrier gas of hydrogen or a noble gas under the atmospheric condition of the partial pressure (pc) of the carbon source gas being held constant (at pc>0) and the partial pressure of the silicon source gas in the atmosphere repeatedly alternating between state ps1 present at an interval of time (ts1) and the state ps2 present at an interval of time (ts2) until the single crystal of silicon carbide is completely formed, where ps1<ps2 such that the partial pressure ratio (pc/ps1) falls within the range of 1–10 times the attachment coefficient ratio (Ss/Sc) and the partial pressure ratio (pc/ps2) falls within the range of less than one time the attachment coefficient ratio (Ss/Sc), wherein Ss denotes the attachment coefficient of silicon source gas to the silicon carbide substrate at the substrate temperature during formation of said silicon carbide and Sc denotes the attachment coefficient of carbon source gas to the silicon carbide substrate at the substrate temperature during the formation of said single crystal of silicon carbide.

9. The method of manufacture according to claim 8, wherein the silicon carbide is at least one member selected from the group consisting of $SiH_4$, $Si_2H_6$, $SiCl_4$, $SiHCl_3$, $SiH_2Cl_2$, $Si(CH_3)_4$, $SiH_2(CH_3)_2$, $SiH(CH_3)_3$ and $Si_{2(CH3)}6$ and said carbon source gas is at least one member selected from the group consisting of $CH_4$, $C_3H_8$, $C_2H_2$, $C_2H_6$, $C_2H_4$, $C_3H_6$, $CCl_4$, $CHF_3$ and $CF_4$.

10. The method of manufacture according to claim 8, wherein ps1 is essentially zero, the time interval (ts1) during which the partial pressure of the silicon source gas is set to ps1 is 0.1–60 seconds, and the time interval (ts2) during which the partial pressure of the carbon source gas is set to ps2 is 0.1–60 seconds.

11. A method of manufacturing silicon carbide, comprising:
   forming a seed crystal of silicon carbide by the method of claim 8; and
   depositing silicon carbide on said seed crystal by vapor phase epitaxy, sublimation recrystallization or liquid deposition.

12. The method of manufacture according to claim 11, wherein silicon carbide blocks of 4–6 inch bore are formed by vapor phase epitaxy, sublimation recrystallization or liquid deposition.

13. A method of manufacturing composite materials, comprising:
   forming a seed crystal of silicon carbide by the method of claim 8; and
   forming diamond and/or a gallium nitride structure on the seed crystal.

14. The method of manufacture according to claim 8, wherein the method of deposition is a CVD or ALE method.

* * * * *